United States Patent
Schaffer

(10) Patent No.: US 8,953,630 B2
(45) Date of Patent: Feb. 10, 2015

(54) CIRCUIT ARRANGEMENT, SYSTEMS FOR TRANSMITTING A SERIAL DATA STREAM, PIXEL MATRIX DISPLAY AND METHOD FOR TRANSMITTING A SERIAL DATA STREAM

(75) Inventor: Josef-Paul Schaffer, Bruckmühl (DE)

(73) Assignee: Infineon Technologies AG, Neubiberg (DE)

( * ) Notice: Subject to any disclaimer, the term of this patent is extended or adjusted under 35 U.S.C. 154(b) by 949 days.

(21) Appl. No.: 12/831,285

(22) Filed: Jul. 7, 2010

(65) Prior Publication Data

US 2011/0013642 A1    Jan. 20, 2011

(30) Foreign Application Priority Data

Jul. 14, 2009 (DE) .......................... 10 2009 033 085

(51) Int. Cl.
| | |
|---|---|
| *H04L 12/28* | (2006.01) |
| *H03M 7/30* | (2006.01) |
| *H04L 25/02* | (2006.01) |
| *H04N 3/12* | (2006.01) |
| *H04J 1/16* | (2006.01) |

(52) U.S. Cl.
CPC ................. *H03M 7/30* (2013.01); *H04L 25/02* (2013.01); *H04N 3/12* (2013.01)
USPC ............................ 370/419; 370/252; 370/463

(58) Field of Classification Search
USPC .......................................... 370/252, 419, 463
See application file for complete search history.

(56) References Cited

U.S. PATENT DOCUMENTS

| | | | | |
|---|---|---|---|---|
| 4,048,440 | A | * | 9/1977 | Peck et al. ..................... 375/370 |
| 4,145,704 | A | * | 3/1979 | Gallo ............................ 386/203 |
| 4,647,927 | A | | 3/1987 | Ichikawa et al. |
| 4,700,358 | A | * | 10/1987 | Duncanson et al. .......... 375/222 |
| 6,778,491 | B1 | * | 8/2004 | Fourcand et al. ............. 370/217 |
| 2003/0018839 | A1 | * | 1/2003 | Ishida ............................ 710/71 |
| 2005/0052373 | A1 | | 3/2005 | Devos et al. |

FOREIGN PATENT DOCUMENTS

| | | |
|---|---|---|
| DE | 3736081 A1 | 10/1987 |
| DE | 3736081 A1 | 5/1989 |
| EP | 475631 B1 | 10/1996 |
| EP | 1016062 B1 | 8/2002 |
| EP | 1110217 B1 | 4/2003 |
| EP | 1744512 A1 | 1/2007 |
| EP | 827300 B1 | 2/2007 |

OTHER PUBLICATIONS

U.Tietze, Ch.Schenk: Halbleiter-Schaltungstechnik: ISBN 3-540-19475-4, Springer-Verlag, 1989, p. 225/226, 254/255.

* cited by examiner

*Primary Examiner* — John Pezzlo
(74) *Attorney, Agent, or Firm* — SpryIP, LLC

(57) ABSTRACT

A circuit arrangement comprises an input circuit for reading in a serial data stream, which comprises a plurality of useful data bits, and for reading in a piece of information which indicates the start of the serial data stream. The circuit arrangement also comprises a data processing circuit for removing at least one useful data bit from the read-in, serial data stream. The data processing circuit is designed such that it removes the at least one useful data bit at a prescribed position after the start of the serial data stream. The circuit arrangement also comprises a first output circuit for outputting the read-in, serial data stream for the omission of the at least one removed useful data bit.

37 Claims, 4 Drawing Sheets

CIRCUIT ARRANGEMENT, SYSTEMS FOR TRANSMITTING A SERIAL DATA STREAM, PIXEL MATRIX DISPLAY AND METHOD FOR TRANSMITTING A SERIAL DATA STREAM

REFERENCE TO RELATED APPLICATIONS

This application claims the benefit of the priority date of German application 10 2009 033 085.2 filed on Jul. 14, 2009, the content of which are herein incorporated by reference.

BACKGROUND

In the field of data transmission, there are a multiplicity of options for transmitting data from a data source to a data sink. By way of example, a distinction is drawn between wired and wireless, parallel and serial, synchronous and asynchronous data transmission. The data transmission can take place in packet-oriented fashion, wherein a data packet can contain not only useful data, such as voice or image data, but also control and protocol data. However, conventional systems for data transmission have the associated drawback that implementing them is complex.

SUMMARY

According to one aspect, a circuit arrangement comprises an input circuit to read in a serial data stream, which comprises a plurality of useful data bits, and to read in a piece of information which indicates the start of the serial data stream. A data processing circuit is provided to remove at least one useful data bit from the read-in, serial data stream, wherein the data processing circuit is configured to remove the at least one useful data bit at a prescribed position after the start of the serial data stream, and a first output circuit to output the read-in, serial data stream with the omission of the at least one removed useful data bit.

According to a further aspect, a system for transmitting a serial data stream has a first circuit arrangement as described above and a second circuit arrangement as described above, wherein a first output circuit of the first circuit arrangement is coupled to an input circuit of the second circuit arrangement for reading in a serial data stream which has been output by the first output circuit of the first circuit arrangement.

According to a further aspect, a system for transmitting a serial data stream has a plurality of circuit arrangements as described above, wherein the plurality of circuit arrangements are arranged in a plurality of rows, wherein each row contains a plurality of circuit arrangements which are connected in series, wherein a first output circuit of a circuit arrangement is coupled to an input circuit of a circuit arrangement connected downstream in series for the purpose of reading in a serial data stream which has been output by the first output circuit of the circuit arrangement.

According to a further aspect, a system for transmitting a serial data stream has a plurality of circuit arrangements, wherein each circuit arrangement comprises an input circuit to read in a serial data stream which comprises a plurality of useful data bits, a data processing circuit to remove at least one useful data bit from the read-in, serial data stream, and a first output circuit to output the read-in serial data stream with the omission of the at least one removed useful data bit. The plurality of circuit arrangements are connected in series and a first output circuit of a circuit arrangement is coupled to an input circuit of a circuit arrangement which is connected downstream in series for reading in the serial data stream which has been output by the first output circuit of the circuit arrangement.

According to a further aspect, a method for transmitting a serial data stream includes reading-in a serial data stream which comprises a plurality of useful data bits, reading-in a piece of information which indicates the start of the serial data stream, removing the at least one useful data bit from the read-in, serial data stream at a prescribed position after the start of the serial data stream, and outputting the read-in, serial data stream with the omission of the at least one removed useful data bit.

DETAILED DESCRIPTION

Figure 1:
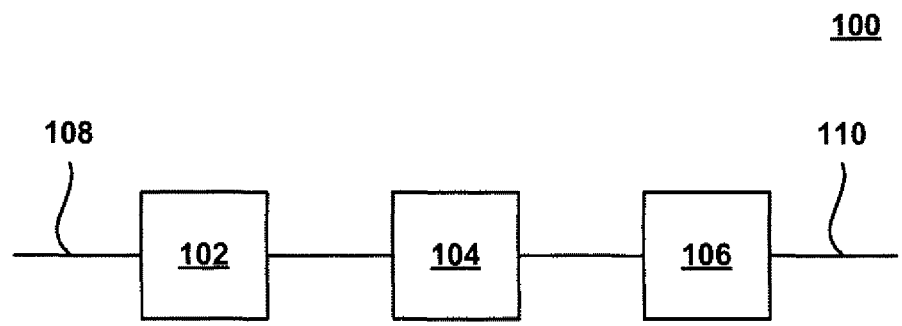
FIG. 1 shows a schematic illustration of an embodiment of the circuit arrangement.

FIG. 1 shows a schematic illustration of an embodiment of a circuit arrangement. A circuit arrangement 100 comprises an input circuit 102, a data processing circuit 104 and a first output circuit 106. The input circuit 102 is coupled to an input line 108 and reads in a serial data stream which is transmitted on the input line 108 to the input circuit 102.

The serial data stream which is transmitted on the input line 108 comprises a plurality of useful data bits, which are in the art also referred to as "payload". Besides the useful data bits, the serial data stream may contain further data bits. These further data bits contain control and protocol data, for example, and are used to organize the transmission of the serial data stream or to ensure the data integrity of the serial data stream, for example. The serial data stream comprises a plurality of data packets, for example, which are transmitted in succession, i.e. in series. In this case, each data packet contains not only the useful data but also further data bits which contain control data or information about the packet, such as the type of the packet, the packet length or a checksum. Within a data packet, these further data bits may either be placed in front of the useful data, referred to as "header", or appended to the useful data, referred to as "trailer".

Besides the useful data, the input circuit 102 reads in a piece of information which indicates the start of the serial data stream. If the serial data stream comprises a plurality of data packets, as described above, then the information about the start of the serial data stream indicates the start of each data packet, for example. The information about the start of the serial data stream can be used by the circuit arrangement 100 to ascertain the position of the first useful data bit in the serial stream of useful data bits within a data packet.

The information about the start of the serial data stream can be transmitted together with the serial data stream on the input line 108. In this case, no separate line is required for transmitting the information about the start of the serial data stream, and the input circuit 102, and hence also the circuit arrangement 100, can be connected to further circuit elements via the input line 108 with reduced wiring complexity. However, the information about the start of the serial data stream can also be transmitted on a separate line which is coupled to the input circuit 102.

The serial data stream can be transmitted to the input circuit 102 synchronously. The input line 108 can be used to transmit a clock signal together with the serial data stream, and the input circuit 102 can recover the clock signal from the serial data stream. In this case, no separate line is required for transmitting the clock signal, and the input circuit 102, and hence also the circuit arrangement 100, can be connected to further circuit elements via the input line 108 using only little wiring complexity. Alternatively, the clock signal can be transmitted on a separate line, which is coupled to the input circuit 102. The clock signal can then be used without further signal processing directly for clocking the input circuit 108, and hence the circuit arrangement 100. In a further embodiment, the data transmission on the input line 108 to the input circuit 102 can also take place asynchronously.

The input circuit 102 is coupled to the data processing circuit 104 and transmits the read-in serial data stream and the information about the start of the serial data stream to the data processing circuit 104. The data processing circuit 104 removes at least one useful data bit from the read-in, serial data stream. Said useful data bit is removed at a prescribed or predefined position after the start of the serial data stream. By way of example, the data processing circuit 104 waits a particular period, for example a particular number of clock cycles, after reception of the information about the start of the serial data stream and then cuts one or more useful data bits from the serial data stream. The prescribed position relative to the start of the serial data stream is firmly programmed into the data processing circuit 104 and also cannot be reprogrammed in exemplary embodiments.

As already mentioned further above, the serial data stream may contain not only useful data bits but also further information, such as control or protocol data. The data processing circuit 104 may be designed such that it removes only useful data bits from the serial data stream, but not the further information. In this case, the data processing circuit 104 forwards the further information to the first output circuit 106 unchanged, i.e. there is no insertion, changing or reorganization of data, for example. The forwarded data stream is in this case identical to the read-in data stream apart from the removed useful data bits.

In addition, the data processing circuit 104 may be designed such that it forwards those useful data from the read-in serial data stream which have not been removed to the first output circuit 106 likewise unchanged. The data processing circuit 104 thus forwards the read-in serial data stream to the first output circuit 106, wherein only those useful data which have been removed by the data processing circuit 104 are omitted.

The data processing circuit 104 is coupled to the first output circuit 106 and transmits the read-in serial useful data stream to the first output circuit 106 with the omission of the at least one removed useful data bit. The first output circuit 106 is coupled to an output line 110 and outputs the serial useful data stream received from the data processing circuit 104 on the output line 110.

In one embodiment, the first output circuit 106 also outputs a clock signal which it receives from the data processing circuit 104 or the input circuit 102. The clock signal can be transmitted together with the serial data stream on the output line 110.

In this case, no separate line is required for the transmission of the clock signal, and the first output circuit 106, and hence also the circuit arrangement 100, can be connected to further circuit elements via the output line 110 using only little wiring complexity.

Figure 2:
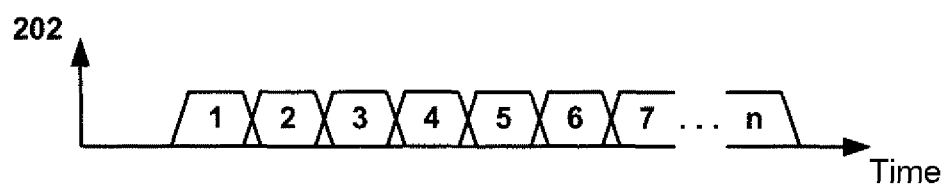
FIG. 2 shows a detail from a time profile for a serial data stream on an input line and on an output line of the circuit arrangement from FIG. 1.
Figure 2:
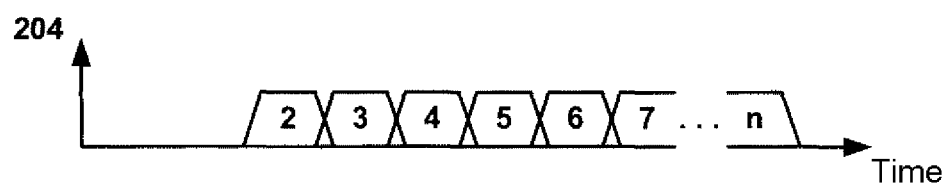

FIG. 2 shows a detail from a time profile for a serial data stream on an input line and on an output line of the circuit arrangement from FIG. 1. An input signal 202 shows a detail from the serial data stream on the input line 108 and an output signal 204 shows a detail from the serial data stream on the output line 110. The detail shows only the useful data bits in the serial data stream. The input signal 202 shows n useful data bits in series, wherein the useful data bit 1 is the first useful data bit which is read in by the input circuit 102 after the start of the serial data stream. The output signal 204 shows n−1 useful data bits in series, wherein the useful data bit 1 has been removed from the serial data stream. In the case of the time profile for the output signal 204 which is shown in FIG. 2, the data processing circuit 104 from FIG. 1 is configured such that it removes the useful data bit which has been read in first after the start of the serial data stream. The position of the data bit which is to be removed can be derived directly from the start of the serial data stream. The data processing circuit 104 therefore does not need to contain any complex logic in order to ascertain the position of the useful data bit which is to be removed. The data processing circuit 104, and consequently also the circuit arrangement 100, can therefore be implemented particularly easily and with only little logic complexity. In another embodiment, the data processing circuit 104 cuts one or more successive useful data bits which are situated at an interval from the start of the serial data stream. That is to say that between the start of the serial data stream and the useful data bits which are to be cut-out there are one or more useful data bits which are not cut-out by the data processing circuit 104. By way of example, bit No. 2 to bit No. 6 are cut-out by the data processing circuit 104.

Figure 3:
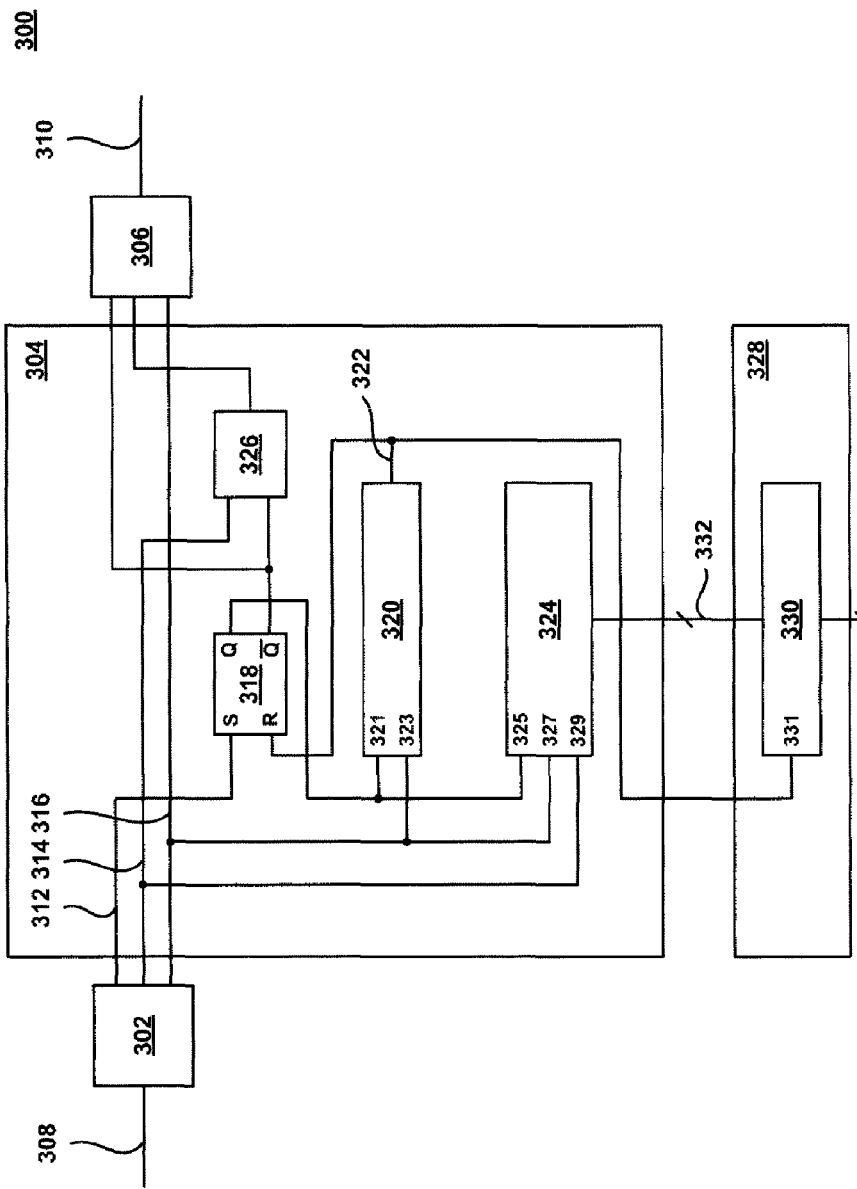
FIG. 3 shows a schematic illustration of a further embodiment of the circuit arrangement.

FIG. 3 shows a schematic illustration of a further embodiment of the circuit arrangement. The circuit arrangement 300 comprises an input circuit 302, a data processing circuit 304 and a first output circuit 306. The input circuit 302 is coupled to an input line 308, and the first output circuit 306 is coupled to an output line 310. The input line 308 is used to transmit a serial data stream to the input circuit 302. The serial data stream contains data bits, including useful data bits, a piece of information about a start of the serial data stream, and information about a clock. The input circuit 302 reads in the serial data stream and uses the read-in data stream to reconstruct the start of the useful data bits, the data bits, including useful data bits, and the clock signal. A signal 312 which indicates the start of the useful data bits is output on a first line, the data bits 314 are output on a second line and the clock signal 316 is output on a third line from the input circuit 302. In this case, the duration of a clock cycle of the clock signal 316 corresponds to the duration of a data bit or of a useful data bit 314.

The data processing circuit 304 comprises an RS-type flip-flop 318, a counter 320, a shift register 324 and an AND gate 326.

The signal 312 which indicates the start of the serially transmitted useful data bits 314 is coupled to a SET input S of the RS-type flipflop 318. With the start of the serial useful data, an output Q of the RS-type flipflop 318 is set to the value of a logic '1', i.e. the RS-type flipflop 318 is set.

The output Q of the RS-type flipflop 318 is coupled to an ENABLE input 321 of the counter 320. A clock input 323 of the counter 320 is coupled to the clock signal 316. The counter 320 is activated when a value of a logic '1' is applied to the ENABLE input 321, i.e. the counter 320 is activated after the start of the serial useful data. In the activated state, the counter 320 increases its counter value with every clock cycle of the clock signal 316, i.e. the counter 320 increases its counter value with every useful data bit 314. The counter 320 has a maximum counter value programmed into it. The maximum counter value is obtained from the number of useful data bits which are removed by the data processing circuit 304. Once the maximum counter value has been reached, the counter 320 sets an output signal 322 to the value of a logic '1'. The output signal 322 from the counter 320 is coupled to a RESET input R of the RS-type flipflop 318. The output Q of the RS-type flipflop 318 is set to the value of a logic '0' as soon as the counter 320 has reached its maximum value, i.e. the RS-type flipflop 318 is reset. Hence, the value of a logic '1' is applied to the output Q of the RS-type flipflop 318 only for the duration of the useful data bits which are to be removed. Resetting the RS-type flipflop 318 in turn prompts the counter 320 to be deactivated and not to count further, i.e. the counter 320 is deactivated after it has reached its maximum counter value.

In a similar manner to the counter 320, the shift register 324 has an ENABLE input 325 which is coupled to the output Q of the RS-type flipflop 318 and a clock input 327 which is coupled to the clock signal 316. In addition, the shift register 324 has a data input 329 which is coupled to the data bits 314. With every clock cycle of the clock signal 316, a useful data bit 314 is shifted into the shift register 324 as long as there is the value of a logic '1' at the ENABLE input 325. As already mentioned above, the output Q of the RS-type flipflop 318 and consequently the ENABLE input 325 of the shift register 324 have the value of a logic '1' applied to them immediately after the start of the serial useful data for the duration of the useful data bits which are to be removed. Consequently, the useful data bits which are to be removed are shifted into the shift register 324 directly after the start of the serial useful data. In the embodiment shown in FIG. 3, the data processing circuit 304 is therefore designed such that it removes the useful data bits which have been read in first after the start of the serial useful data.

The RS-type flipflop 318 has not only the output Q but also an output Qquer which has a value applied to it which corresponds to the inverted value of the output Q. The output Qquer of the RS-type flipflop 318 is coupled to a first input of the AND gate 326. A second input of the AND gate 326 is coupled to the data bits 314. Since the output Qquer of the RS-type flipflop 318 has a value of a logic '0' applied to it for the duration of the useful data bits which are to be removed, the data bits 314 are not output by the AND gate 326 at its output during this time. For the time at which the output Qquer of the RS-type flipflop 318 has the value of a logic '1' applied to it, the data bits 314 are output at the output of the AND gate 326. The output of the AND gate 326 therefore has the data bits 314 which have been read in by the input circuit 302 available with the omission of the useful data bits which are to be removed.

The output of the AND gate 326 is coupled to the first output circuit 306. Further, the first output circuit 306 is coupled to the clock signal 316 and to the output Qquer of the RS-type flipflop 318. The output Qquer of the RS-type flipflop 318 assumes the value of a logic '1' as soon as the useful data bits which are to be removed have been removed from the data stream 314. Hence, a rising edge of the output Qquer indicates the start of the remaining useful data bits in the data stream 314. The first output circuit 306 encodes the data bits, including the remaining useful data bits, the information about the start of the remaining useful data bits and the clock signal 316 such that they are output by the first output circuit 306 on a single output line 310 as a serial data stream.

The circuit arrangement 300 also comprises a second output circuit 328 which is coupled to the data processing circuit 304. The second output circuit 328 contains a latch 330. A sampling input 331, referred in the art as a "strobe", of the latch 330 is coupled to the output signal 322 of the counter 320. Further inputs of the latch 330 are coupled to data output signals 332 from the shift register 324. When the counter 320 sets its output signal 322 to the value of a logic '1', the latch 330 adopts the data on the data output signals 332 from the shift register 324 and stores the data. At the time at which the counter 320 sets its output signal 322 to the value of a logic '1', the shift register 324 contains the useful data bits which are to be removed. The latch 330, and hence the second output circuit 328, is coupled to output lines 334 onto which the stored data are output. The second output circuit 328 therefore outputs the removed useful data bits onto the output lines 334.

In one embodiment, the removed useful data bits contain information relating to the control of the state of an display element. By way of example, the brightness of the display element can be controlled. The display element is coupled to the output lines 334 of the second output circuit 328. The display element may comprise light-emitting modules, such as LEDs, and the removed useful data bits may contain information about the brightness for one or more of the colour components red, green and blue.

A system for transmitting a serial data stream contains a plurality of circuit arrangements 100 or a plurality of circuit arrangements 300. In this case, the system comprises a first circuit arrangement and a second circuit arrangement which are connected in series. A first output circuit of the first circuit arrangement is coupled to an input circuit of the second circuit arrangement. The input circuit of the second circuit arrangement reads in a serial data stream which is output by the first output circuit of the first circuit arrangement. Each circuit arrangement in the system is a data sink. Within the system, useful data bits are transmitted to a plurality of data sinks. Each data sink takes out at least one useful data bit at a prescribed position after the start of the serial data stream from the read-in serial data stream and forwards the remaining useful data bits to a data sink which is kept downstream in series. The system allows useful data bits to be transmitted to a plurality of data sinks using only little wiring complexity and little logic complexity. In addition, within each data sink or circuit arrangement, the serial data stream is read in by the input circuit. The reading-in regenerates the read-in signal. The signal from the serial data stream is available in regenerated fashion at the output of each circuit arrangement for the circuit arrangement connected downstream in series. Within the system, a continuously good signal quality is therefore guaranteed.

In one embodiment of the system, the first circuit arrangement removes the same number of useful data bits as the second circuit arrangement. To be more precise, the data processing circuits of the first circuit arrangement and of the second circuit arrangement each remove the same number of useful data bits from the serial data stream which has been read in by the input circuits of the first circuit arrangement and the second circuit arrangement in each case.

In a further embodiment of the system, the prescribed position after the start of the serial data stream at which the data processing circuit of the first circuit arrangement takes at least one useful data bit corresponds to the prescribed position at which the data processing circuit of the second circuit arrangement takes at least one useful data bit. By way of example, both the data processing circuit of the first circuit arrangement and the data processing circuit of the second circuit arrangement remove the useful data bit which is read in first after the start of the serial data stream. In this case, the position of the useful data bits which are to be removed can be derived directly from the information about the start of the serial data stream. Ascertaining this position requires only little logic complexity.

In another embodiment, all circuit arrangements, and hence also the first circuit arrangement and the second circuit arrangement, within the system are of identical design. The design of the circuit arrangements is therefore independent of their position within the system. The circuit arrangements can be interchanged without the need for reprogramming of the system. In addition, circuit arrangements can be added to the system and circuit arrangements can be removed from the system without the need for the circuit arrangements to be programmed or reprogrammed.

Figure 4:
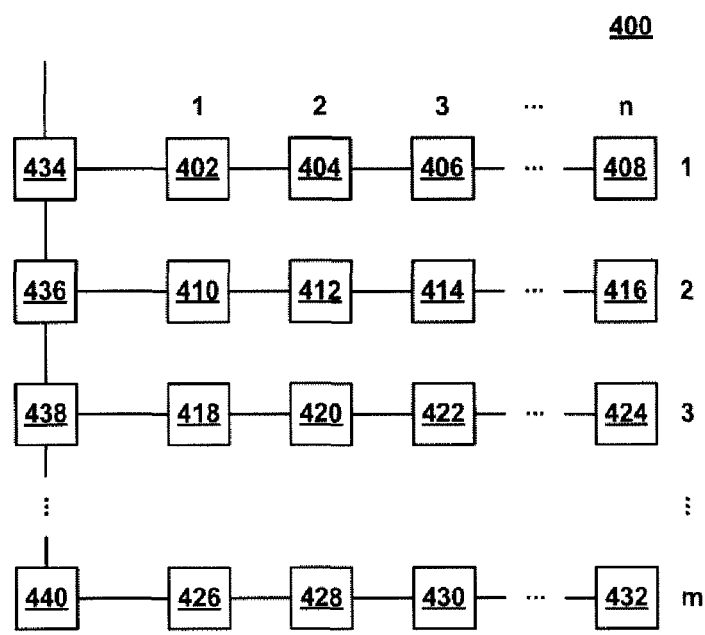
FIG. 4 shows a schematic illustration of an embodiment of the system.

FIG. 4 shows a schematic illustration of an embodiment of a further system for transmitting a serial data stream. The system 400 comprises a plurality of circuit arrangements 402-432. The circuit arrangements 402-432 correspond to one of the exemplary embodiments of the circuit arrangements 100, 300, as have been described with reference to FIG. 1, FIG. 2 and FIG. 3.

The circuit arrangements 402-432 are arranged in m rows, and each row contains n circuit arrangements 402-432 which are connected in series within the row. The circuit arrangements 402-432 of the system 400 form an array of m×n circuit arrangements. In this case, within a row, a first output circuit of a circuit arrangement is coupled to an input circuit of a further circuit arrangement which is connected downstream in series. The input circuit of the further circuit arrangement reads in a serial data stream which is output by the first output circuit of the upstream circuit arrangement.

For each of the m rows, an intermediate circuit 434, 436, 438, 440 is provided. Each intermediate circuit 434, 436, 438, 440 reads in a serial data stream at an input and removes a plurality of useful data bits from the read-in, serial data stream. In addition, the intermediate circuits 434, 436, 438 output the read-in serial data stream at a first output with the omission of the plurality of removed useful data bits. The intermediate circuit 440 outputs no data at its first output. At a second output, each intermediate circuit 434, 436, 438, 440 outputs the plurality of removed useful data bits. The second output of each intermediate circuit 434, 436, 438, 440 is coupled to an input circuit of that circuit arrangement 402-432 which is located at the start of the series of circuit arrangements in the respective row.

By way of example, the second output of the intermediate circuit 434, which is associated with the first row in the system 400, is coupled to the input circuit of the circuit arrangement 402. The circuit arrangement 402 is the first circuit arrangement in the series of circuit arrangements 402, 404, 406, 408 in the first row. The intermediate circuit 434 takes out a plurality of useful data bits from a serial data stream which it reads in at its input. The removed useful data bits are forwarded via the second output of the intermediate circuit 434 to the circuit arrangements 402, 404, 406, 408 which are arranged in the first row of the system 400.

The intermediate circuits 434, 436, 438, 440 are connected in series, wherein a first output of an intermediate circuit 434, 436, 438 is coupled to an input of a further intermediate circuit 436, 438, 440 which is connected downstream in series. Each of the intermediate circuits 434, 436, 438 outputs the read-in serial data stream at its first output, wherein those useful data bits which have been removed by the respective intermediate circuit 434, 436, 438 are omitted. In one embodiment, the first output of the intermediate circuit 434, 436, 438 omits only those useful data bits which have been removed by the intermediate circuit 434, 436, 438. Useful data bits which have not been removed by the intermediate circuit 434, 436, 438, and further data in the serial data stream, are not omitted at the first output of the intermediate circuit 434, 436, 438 but rather are output. The intermediate circuit 440 forms the last intermediate circuit 440 in the series of intermediate circuits 434, 436, 438, 440. In one embodiment, the last intermediate circuit 440 outputs no data at its first output, and its first output is not coupled to a further circuit.

The system 400 allows useful data from a serial data stream to be transmitted to a plurality of circuit arrangements 402-432 with only little wiring complexity. The circuit arrangements 402-432 are arranged in m rows, so that useful data are at least from time to time transmitted in each of the m rows serially from one circuit arrangement to a downstream circuit arrangement. This allows useful data bits within the system 400 to be transmitted to the circuit arrangements 402-432 within a short time.

In the embodiment of the system 400 which is illustrated in FIG. 4, each of the m rows contains the same number n of circuit arrangements. In another embodiment, the number of circuit arrangements per row differs. By way of example, the second row contains only two circuit arrangements.

The system 400 described with reference to FIG. 4 is a two-dimensional array of m×n circuit arrangements. In a further embodiment, the circuit arrangements and the intermediate circuits form a multidimensional array, for example a three dimensional array.

Figure 5:
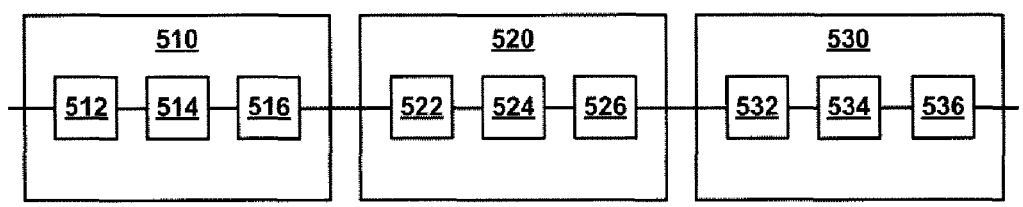
FIG. 5 shows a schematic illustration of a further embodiment of the system.

FIG. 5 shows a schematic illustration of an embodiment of a further system for transmitting a serial data stream. The system 500 comprises a plurality of circuit arrangements 510, 520, 530. Each of the circuit arrangements 510, 520, 530 comprises an input circuit 512, 522, 532, a data processing circuit 514, 524, 534 and a first output circuit 516, 526, 536. Within each of the circuit arrangements 510, 520, 530, the input circuit 512, 522, 532 reads in a serial data stream which comprises a plurality of useful data bits. The data processing circuit 514, 524, 534 is coupled to the input circuit 512, 522, 532 and removes at least one useful data bit from the read-in, serial data stream. The first output circuit 516, 526, 536 is coupled to the data processing circuit 514, 524, 534 and outputs the read-in, serial data stream, wherein the at least one removed useful data bit is omitted.

The plurality of circuit arrangements 510, 520, 530 are connected in series. In this case, a first output circuit 516, 526, 536 of a circuit arrangement 510, 520, 530 is coupled to an input circuit 512, 522, 532 of a circuit arrangement 510, 520, 530 which is connected downstream in series. By way of example, the first output circuit 516 of the circuit arrangement 510 is coupled to the input circuit 522 of the circuit arrangement 520, and the input circuit 522 reads in the serial data stream which has been output by the first output circuit 516.

Within the system 500, a serial data stream is transmitted to a plurality of circuit arrangements 510, 520, 530 which are connected in series. Each of the circuit arrangements 510, 520, 530 takes one or more useful data bits from the serial data stream and forwards the remaining data stream to the circuit arrangement 510, 520, 530 which is connected downstream in series. Each circuit arrangement 510, 520, 530 in the system 500 is therefore a data sink which cuts out a portion of the useful data from the serial data stream. The system 500 can have data sinks added without the need for the added or the already available data sinks to be programmed or reprogrammed. The system 500 allows a freely scalable arrangement of a plurality of series-connected data sinks, and the system 500 therefore has a high degree of flexibility.

In one embodiment of the system 500, the circuit arrangements 510, 520, 530 are of identical design. In this case, the design of the circuit arrangements 510, 520, 530 is independent of their position within the system 500. Hence, the circuit arrangements 510, 520, 530 can easily be interchanged, added or removed within the system 500.

The serial data stream which is transmitted to a plurality of data sinks in the system 500 may contain not only useful data but also further data, such as control or protocol data. In one embodiment, the data processing circuits 514, 524, 534 remove only useful data bits from the serial data stream. The first output circuits 516, 526, 536 output the serial data stream which has been read in by the input circuits 512, 522, 532, wherein only those useful data bits which have been removed by the data processing circuits 514, 524, 534 are omitted. The further data, such as the control and protocol data, and the other useful data bits which have not been removed are output by the first output circuits 516, 526, 536.

In a further embodiment of the system 500, each circuit arrangement 510, 520, 530 contains a second output circuit (not shown in FIG. 5). Within the circuit arrangement 510, 520, 530, the second output circuit is coupled to the data processing circuit 514, 524, 534, and the second output circuit outputs the useful data bits which have been removed by the data processing circuit 514, 524, 534. The useful data bits at the output of the second output circuit can control a further circuit element which is coupled to the circuit arrangement 510, 520, 530.

The systems described in the preceding sections can be used to control display elements in a pixel matrix display. In this case the circuit arrangements control pixel matrix elements. In one embodiment, the second output circuit of each circuit arrangement is coupled to a pixel matrix element of the pixel matrix display. The second output circuit is used to transmit useful data bits to the pixel matrix element in order to control the pixel matrix element. The display elements of the pixel matrix display may contain light-emitting modules, such as LEDs or LCD segments.

Figure 6:
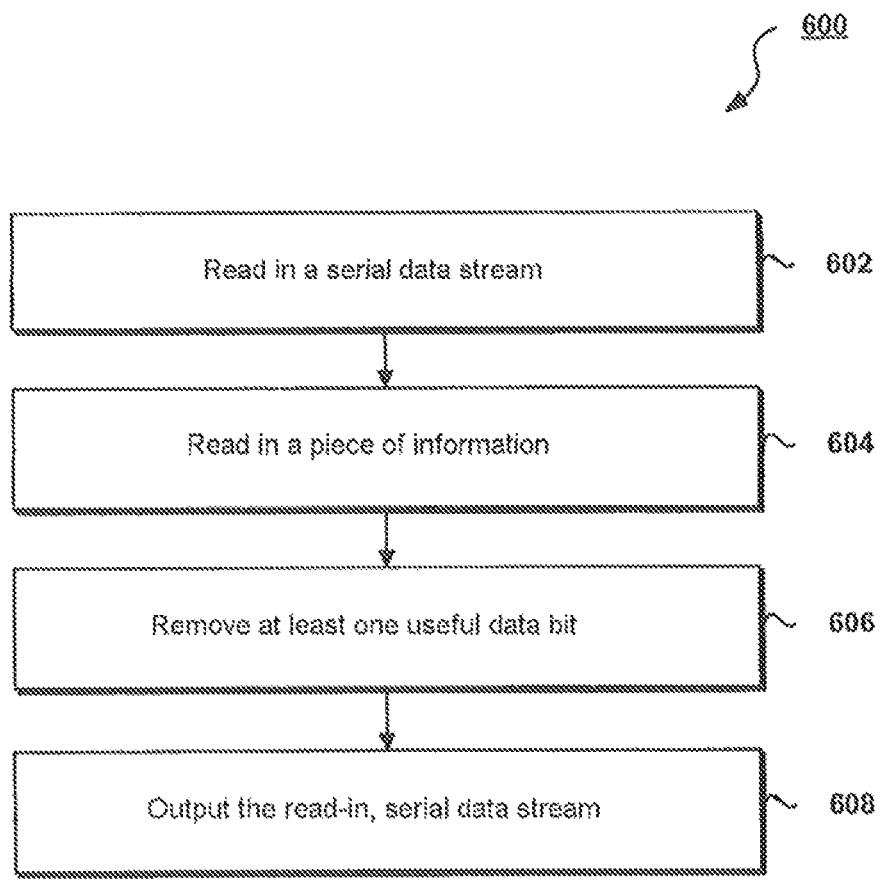
FIG. 6 shows a flowchart for a method for transmitting a serial data stream.

FIG. 6 shows a flowchart for a method 600 for transmitting a serial data stream.

In 602, a serial data stream is read in which comprises a plurality of useful data bits.

In 604, a piece of information is read in which indicates the start of the serial data stream.

In 606, at least one useful data bit is removed from the read-in serial data stream. Said bit is removed at a prescribed position after the start of the serial data stream. In one embodiment, the at least one useful data bit which is read in first after the start of the serial data stream is removed. In a further embodiment, only one or more useful data bits are removed from the read-in, serial data stream. Further data which is contained in the read-in, serial data stream, such as control and protocol data, are not removed.

In 608, the read-in, serial data stream is output, wherein the at least one removed useful data bit is omitted. In one embodiment, the output involves only the at least one removed useful data bit being omitted. All further data in the serial data stream are output.

In one embodiment, the at least one removed useful data bit is likewise output, and an display element is controlled with the at least one removed useful data bit.

The invention claimed is:

1. Circuit arrangement comprising:
   an input circuit to read in a serial data stream, which comprises a plurality of useful data bits, and to read in a piece of information which indicates the start of the serial data stream,
   a data processing circuit to remove at least one useful data bit from the read-in, serial data stream, wherein the data processing circuit is configured to remove the at least one useful data bit at a prescribed position after the start of the serial data stream, and
   a first output circuit to output the read-in, serial data stream with the omission of the at least one removed useful data bit.

2. Circuit arrangement according to claim 1, wherein the first output circuit is configured to output the read-in serial data stream with the omission of only the at least one removed useful data bit.

3. Circuit arrangement according to claim 1, wherein the data processing circuit is configured to remove merely one or more useful data bits from the read-in, serial data stream.

4. Circuit arrangement according to claim 1 comprising:
   a second output circuit to output the at least one removed useful data bit.

5. Circuit arrangement according to claim 4, wherein the at least one removed useful data bit contains information for controlling a state of an display element.

6. Circuit arrangement according to claim 4, wherein the second output circuit is configured to be coupled to a light-emitting module.

7. Circuit arrangement according to claim 6, wherein the light-emitting module comprises an LED.

8. Circuit arrangement according to claim 1, wherein the at least one removed useful data bit contains information relating to the brightness for at least one of the colour components red, green and blue.

9. Circuit arrangement according to claim 1, wherein the input circuit can be coupled to an input line on which the serial data stream which has been read in by the input circuit is transmitted.

10. Circuit arrangement according to claim 9, wherein the input line is used to transmit the read-in, serial data stream together with a clock signal.

11. Circuit arrangement according to claim 9 wherein the input line is used to transmit the read-in, serial data stream together with the information which indicates the start of the serial data stream.

12. Circuit arrangement according to claim 1, wherein the first output circuit can be coupled to an output line on which the serial data stream which has been output by the first output circuit is transmitted.

13. Circuit arrangement according to claim 12, wherein the output line is used to transmit the output, serial data stream together with a clock signal.

14. Circuit arrangement according to claim 1, wherein the data processing circuit is configured to remove the at least one useful data bit which has been read in first after the start of the serial data stream.

15. The apparatus according to claim 1, wherein the removed at least one useful data bit is included in a payload of the serial data stream.

16. An apparatus for transmitting a serial data stream comprising:
   a first circuit arrangement according to claim 1 and
   a second circuit arrangement according to claim 1, wherein a first output circuit of the first circuit arrangement is coupled to an input circuit of the second circuit arrangement for reading in a serial data stream which has been output by the first output circuit of the first circuit arrangement.

17. The apparatus according to claim 16, wherein a data processing circuit of the first circuit arrangement is configured to remove the same number of useful data bits as a data processing circuit of the second circuit arrangement.

18. The apparatus according to claim 16, wherein a data processing circuit of the first circuit arrangement is set up such that a prescribed position after the start of the serial data stream corresponds to a prescribed position after the start of the serial data stream of the second circuit arrangement.

19. The apparatus according to claim 18, wherein both the data processing circuit of the first circuit arrangement and the data processing circuit of the second circuit arrangement are configured to remove the at least one useful data bit which has been read in first after the start of the serial data stream.

20. The apparatus according to claim 16, wherein the first circuit arrangement and the second circuit arrangement are of identical design.

21. Pixel matrix display having an apparatus according to claim 16 for controlling display elements.

22. Pixel matrix display according to claim 21, wherein the display elements comprise light-emitting modules, the light-emitting modules comprising LEDs.

23. An apparatus for transmitting a serial data stream comprising:
a plurality of circuit arrangements according to claim 1, wherein the plurality of circuit arrangements are arranged in a plurality of rows, wherein each row contains a plurality of circuit arrangements which are connected in series,
wherein a first output circuit of a circuit arrangement is coupled to an input circuit of a circuit arrangement connected downstream in series for the purpose of reading in a serial data stream which has been output by the first output circuit of the circuit arrangement.

24. The apparatus according to claim 23, wherein the plurality of circuit arrangements which are arranged in a plurality of rows form an array of circuit arrangements.

25. The apparatus according to claim 23, wherein for each row a respective intermediate circuit is provided, the intermediate circuit being configured to:
read in a serial data stream at an input,
remove a plurality of useful data bits from the read-in serial data stream,
output the read-in serial data stream at a first output with the omission of the plurality of removed useful data bits and
output the plurality of removed useful data bits at a second output,
wherein the second output is coupled to an input circuit of the first of the series-connected circuit arrangements in the respective row.

26. The apparatus according to claim 25, wherein the intermediate circuits for each row are configured to output the read-in, serial data stream at the first output with the omission of merely the plurality of removed useful data bits.

27. The apparatus according to claim 25, wherein the intermediate circuits for each row are connected in series, wherein a first output of an intermediate circuit is coupled to an input of an intermediate circuit which is connected downstream in series.

28. System for transmitting a serial data stream comprising:
a plurality of circuit arrangements, wherein each circuit arrangement comprises:
an input circuit to read in a serial data stream which comprises a plurality of useful data bits,
a data processing circuit to remove at least one useful data bit from the read-in, serial data stream, and
a first output circuit to output the read-in serial data stream with the omission of the at least one removed useful data bit,
wherein the plurality of circuit arrangements are connected in series and wherein a first output circuit of a circuit arrangement is coupled to an input circuit of a circuit arrangement which is connected downstream in series for reading in the serial data stream which has been output by the first output circuit of the circuit arrangement.

29. System according to claim 28, wherein the plurality of circuit arrangements are of identical design.

30. System according to claim 28, wherein the first output circuit of each circuit arrangement in the plurality of the circuit arrangements is configured to output the read-in serial data stream with the omission of merely the at least one removed useful data bit.

31. System according to one of claim 28, wherein each circuit arrangement in the plurality of circuit arrangements comprises a second output circuit for outputting the at least one removed useful data bit.

32. Method for transmitting a serial data stream, comprising:
reading-in a serial data stream which comprises a plurality of useful data bits,
reading-in a piece of information which indicates the start of the serial data stream,
removing the at least one useful data bit from the read-in, serial data stream at a prescribed position after the start of the serial data stream, and
outputting the read-in, serial data stream with the omission of the at least one removed useful data bit.

33. Method according to claim 32, wherein the read-in serial data stream is output with the omission of only the at least one removed useful data bit.

34. Method according to claim 32, wherein merely one or more useful data bits are removed from the read-in, serial data stream.

35. Method according to claim 32, further comprising:
outputting the at least one removed useful data bit and
controlling an display element with the at least one removed useful data bit.

36. Method according to claim 32, wherein the at least one useful data bit which is first read in after the start of the serial data stream is removed.

37. Method according to claim 32, wherein the removed at least one useful data bit is included in a payload of the serial data stream.

* * * * *